United States Patent [19]

Eastty et al.

[11] Patent Number: 6,057,792
[45] Date of Patent: May 2, 2000

[54] SIGNAL PROCESSORS

[75] Inventors: Peter Charles Eastty, Oxford; Christopher Sleight, Chipping Norton; Peter Damien Thorpe, Oxford, all of United Kingdom

[73] Assignees: Sony Corporation, Tokyo, Japan; Sony United Kingdom Limited, Weybridge, United Kingdom

[21] Appl. No.: 08/979,756

[22] Filed: Nov. 26, 1997

[30] Foreign Application Priority Data

Mar. 20, 1997 [GB] United Kingdom .................... 9705722

[51] Int. Cl.$^7$ ...................................................... H03M 3/00
[52] U.S. Cl. ............................................... 341/143; 341/77
[58] Field of Search ................................. 341/76, 77, 143

[56] References Cited

U.S. PATENT DOCUMENTS 5,877,716   3/1999   Tagami ..................................... 341/143

OTHER PUBLICATIONS

*Highly selective 'analog' filters using ΔΣ based IIR filtering* Johns, D.A.; Lewis, D.M.; Cherepacha, D Circuits and Systems, 1993., ISCAS '93, 1993 IEEE International Symposium on, pp.: 1302–1305 vol. 2.
*Sigma–delta based IIR filters* Johns, D.A.; Lewis, D.M. Circuits and Systems, 1991., Proceedings of the 34th Midwest Symposium on , pp.:210–213 vol. 1.
*Design and analysis of delta–sigma based IIR filters* Johns, D.A.; Lewis, D.M. Circuits and Systems II: Analog and Digital Signal Processing, IEEE Transactions on vol.: 40 4, pp.: 233–240.
*One bit digital filtering* Angus, J.A.S. Digital Filters: An Enabling Technology (Ref. No. 1998/252), IEE Colloquium on , pp.: 8/1–8/6.
*One bit higher order sigma–delta A/D converters* Ferguson, P.F., J.; Ganesan, A.; Adams, R.W. Circuits and Systems, 1990., IEEE International Symposium on , pp.: 890–893 vol. 2.

*Primary Examiner*—Howard L. Williams
*Attorney, Agent, or Firm*—Frommer Lawrence & Haug, LLP.; William S. Frommer

[57] ABSTRACT

An nth order Delta Sigma Modulator (DSM) where $n \geq 1$, comprising an input (4) for receiving a 1-bit input signal having a signal component and a noise component, a quantifier (Q) for re-quantizing a p-bit signal (where p>1) to 1-bit form, the re-quantised 1-bit signal being the output signal of the DSM, a first combiner (a, A, 61, 71) for forming the integral (71) of an additive (61) combination of the product of the input 1-bit signal and a coefficient (a) and of the product of the output signal and a coefficient (A), n−1 intermediate combiners each for forming the integral of an additive combination of the product of the input 1-bit signal and a coefficient, of the product of the output signal and a coefficient and of the integral of the additive combination of the preceding combiner and a final combiner (d, 64) for forming an additive combination (64) of the input signal and a coefficient (d) and of the integral of the combiner of the preceding combination to form the said p-bit signal re-quantised by the quantifier (Q), wherein the transfer function applied by the DSM to the input 1-bit signal is $$\frac{a_0(1+a_1z^{-1})(1+a_2z^{-1})(1+a_3z^{-1})\ldots(1+a_nz^{-1})}{(1+b_1z^{-1})(1+b_2z^{-1})(1+b_3z^{-1})\ldots(1+a_nz^{-1})}$$

the transfer function applied to the quantized noise introduced by the quantizer is $$\frac{(1-z^{-1})^n}{(1+b_1z^{-1})(1+b_2z^{-1})(1+b_3z^{-1})\ldots(1+b_nz^{-1})}$$

wherein at least one of $a_1$ to $a_n$ equals +1, and each of $b_1$ to $b_n$ is not equal to +1.

13 Claims, 6 Drawing Sheets

Analysis of audio signal path for a 5th order DSM.

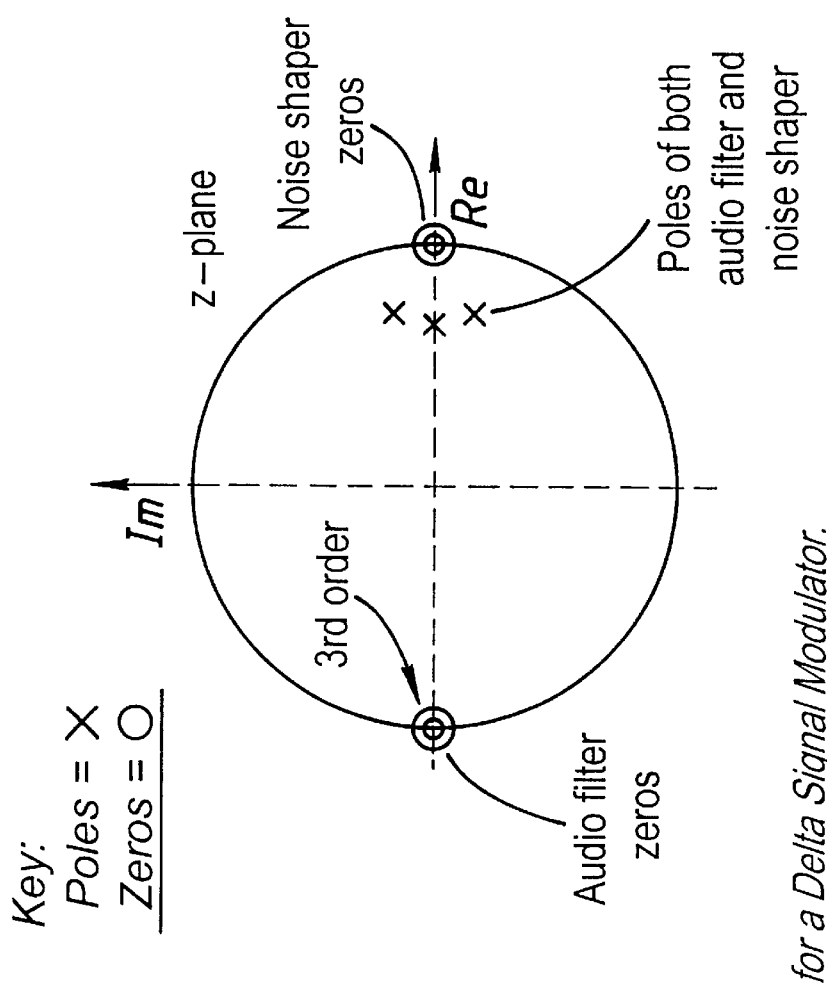
FIG. 4B  (Low pass filter responce)
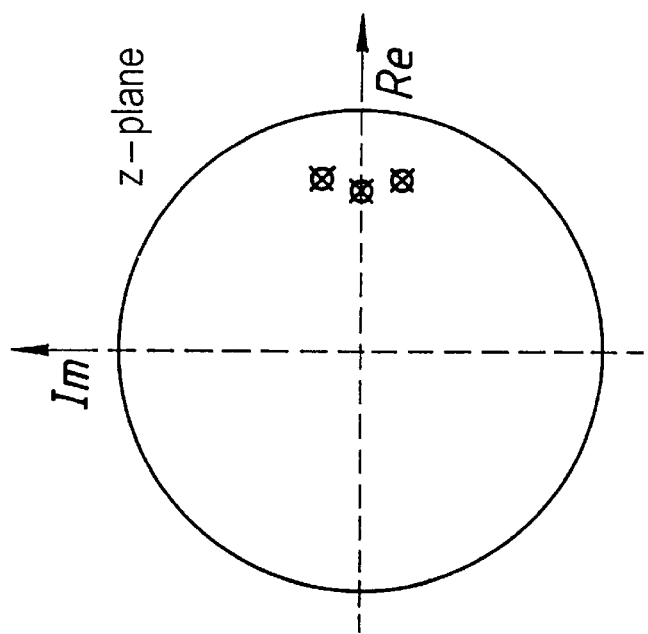
FIG. 4A  (Flat response)
Audio filter function for a Delta Signal Modulator.

FIG. 5 3rd order DSM with low pass input filter.

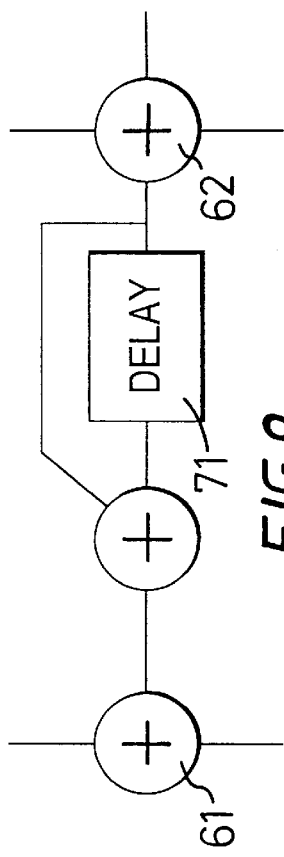
FIG.9
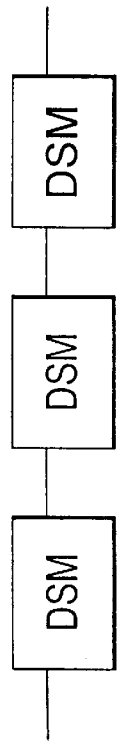
FIG.8
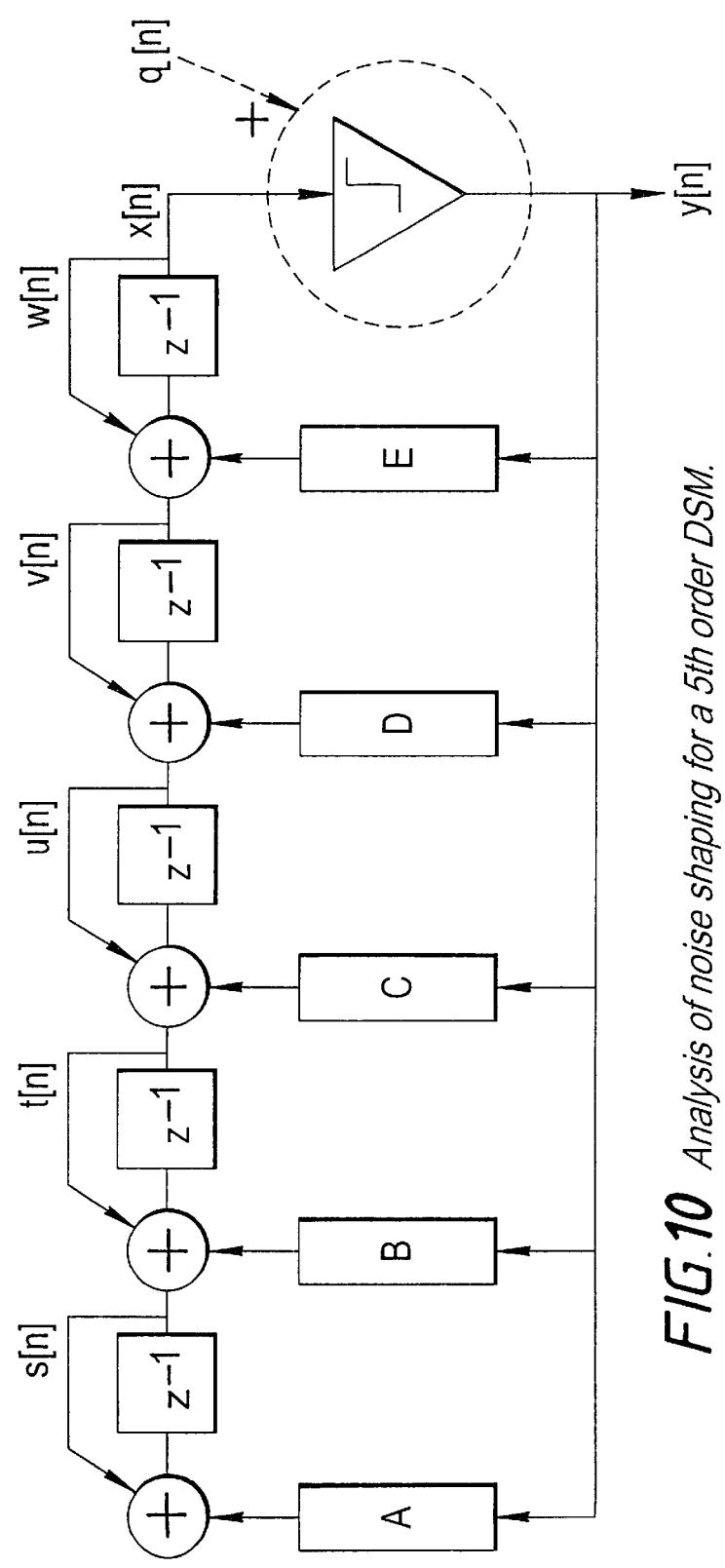
FIG.10 *Analysis of noise shaping for a 5th order DSM.*

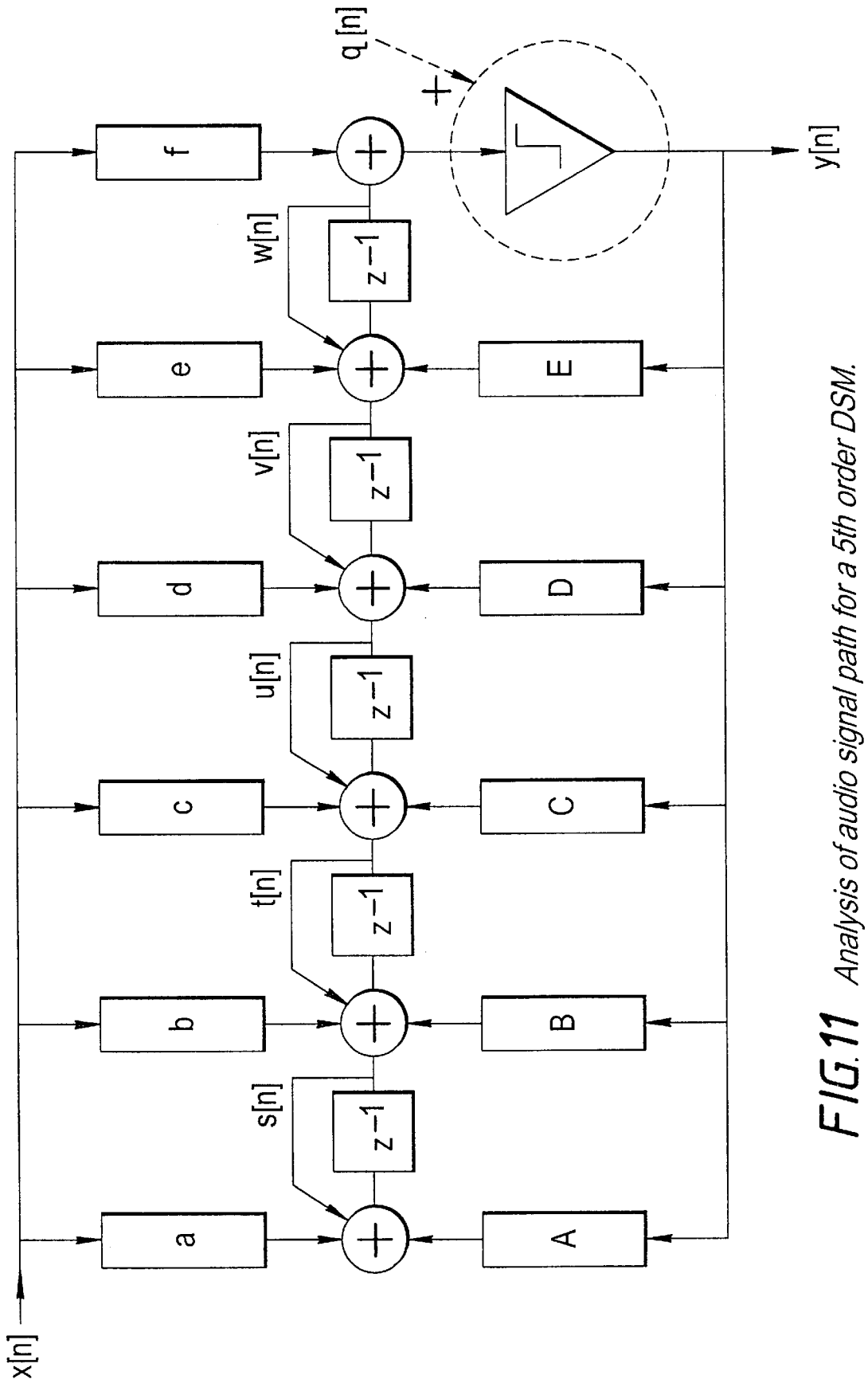
FIG.11  Analysis of audio signal path for a 5th order DSM.

SIGNAL PROCESSORS

BACKGROUND OF THE INVENTION

1. Field of the Invention

The present invention relates to a 1-bit signal processor comprising an nth order Delta-Sigma Modulator (DSM) having a filter section where n is at least one. Preferred embodiments of the invention relate to processing audio signals but the invention is not limited to audio signal processors.

2. Description of the Prior Art

Background to the present invention will now be described by way of example with reference to FIGS. 1, 2 and 3 of the accompanying drawings of which FIG. 1 is a block diagram of a known Delta-Sigma Modulator, FIG. 2 is a block diagram of a previously proposed Delta-Sigma Modulator configured as an 3rd order (n=3) filter section FIG. 3 shows a noise shaping characteristic, and FIG. 4(*a*) is a pole zero diagram of a previously proposed DSM.

It is known to convert an analogue signal to a digital form by sampling the analogue signal at at least the Nyquist rate and encoding the amplitudes of the samples by an m bit number. Thus if m=8, the sample is said to be quantized to an accuracy of 8 bits. In general m can be any number of bits equal to or greater than 1.

For the purpose of quantizing to only 1 bit, it is known to provide an analogue to digital converter (ADC) known either as a "Sigma-Delta ADC" or as a "Delta-Sigma ADC". Herein the term "Delta-Sigma" is used. Such an ADC is described in for example "A Simple Approach to Digital Signal Processing" by Craig Marven and Gillian Ewers ISBN 0-904.047-00-8 published 1993 by Texas Instruments.

Referring to FIG. 1 in an example of such an ADC, the difference 1 (Delta) between an analogue input signal and the integral 2 (Sigma) of the 1-bit output signal is fed to a 1-bit quantizer 3. The output signal comprises bits of logical value 0 and 1 but representing actual values of–1 and +1 respectively. The integrator 3 accumulates the 1-bit outputs so that value stored in it tends to follow the value of the analog signal. The quantizer 3 increases (+1) or reduces (−1) the accumulated value by 1-bit as each bit is produced. The ADC requires a very high sampling rate to allow the production of an output bit stream the accumulated value of which follows the analogue signal.

The term "1-bit" signal as used in the following description and in the claims means a signal quantized to an accuracy of 1 digital bit such as is produced by a Delta-Sigma ADC.

A Delta-Sigma Modulator (DSM) configured as nth order filter section for directly processing a 1-bit signal was proposed by N. M. Casey and James A. S. Angus in a paper presented at the 95th AES Convention Oct. 7–10, 1993 New York, USA entitled "One Bit Digital Processing of Audio Signals"—Signal Processing: Audio Research Group, The Electronics Department, The University of York, Heslington, York YO1 5DD England. FIG. 2 shows a 3rd order (n=3) version of such a DSM filter section.

Referring to FIG. 2, the DSM has an input 4 for a 1-bit audio signal and an output 5 at which a processed 1-bit signal is produced. The bits of the 1-bit signal are clocked through the DSM by known clocking arrangements which are not shown. The output 1-bit signal is produced by a 1-bit quantizer Q which is for example a comparator having a threshold level of zero. The DSM has three stages each comprising a first 1-bit multiplier $a_1$, $a_2$, $a_3$ connected to the input 4, a second 1-bit multiplier $c_1$, $c_2$, $c_3$ connected to the output 5, an adder $6_1$, $6_2$, $6_3$ and an integrator $7_1$, $7_2$, $7_3$.

The 1-bit multipliers multiply the received 1-bit signal by p bit coefficients $A_1$, $A_2$, $A_3$, $C_1$ $C_2$, $C_3$ producing p bit products which are added by the adders $6_1$, $6_2$, $6_3$ and the sums passed to the integrators $7_1$, $7_2$, $7_3$. In the intermediate stages the adders $6_2$, $6_3$ also sum the output of the integrator of the preceding stage. A final stage comprises another 1-bit multiplier $a_4$ connected to the input which multiplies the input signal by a p bit coefficient $A_4$ and an adder $6_4$ which adds the product to the output of the integrator $7_3$ of the preceding stage. The sum is passed to the quantizer 2.

Within the DSM, two's complement arithmetic maybe used to represent the positive and negative p bit numbers. The input to the quantizer Q may be positive, quantized at the output as +1 (logical 1) or negative quantized at the output as −1 (logical 0).

As observed by Casey and Angus "a one bit processor . . . will produce a one bit output that contains an audio signal that is obscured by noise to an unacceptable level and it is imperative the quantization noise is suitably shaped". The noise which obscures the audio signal is the quantization noise produced by the quantizer Q.

The quantizer Q may be modelled as an adder which has a first input receiving an audio signal and a second input receiving a random bit stream (the quantization noise) substantially uncorrelated with the audio signal. Modelled on that basis, the audio signal received at the input 4 is fed forward by multipliers $a_1$, $a_2$, $a_3$, $a_4$ to the output 5 and fed back by multipliers $c_1$, $c_2$, $c_3$ from the output 5. Thus coefficients A1 to A4 in the feed forward path define zeros of the Z-transform transfer function of the audio signal and coefficients C1–C3 in the feed back path define poles of the transfer function of the audio signal.

The noise signal generated by the quantizer Q, is subject to the multipliers $c_1$–$c_3$ and to the adders 61–64 and integrators 71–73 but not subject to the multipliers $a_1$–$a_4$. The transfer function of the noise signal is not the same as that of the input signal.

The coefficients A1 to A4 and C1 to C3 are chosen to provide circuit stability amongst other desired properties.

The coefficients C1–C3 are chosen to shape the noise generated by the quantizer Q so as to minimise quantization noise in the audio band, as shown for example in FIG. 3 by the full line 31.

The coefficients A1–A4 and C1–C3 are also chosen for a desired audio signal processing characteristic.

The coefficients A1–A4 and C1–C3 may be chosen by:
a) finding the Z-transform H(z) of the desired filter characteristic—e.g. noise shaping function; and
b) transforming H(z) to coefficients.
This may be done by the methods described in the papers "Theory and Practical Implementation of a Fifth Order Sigma-Delta A/D Converter, Journal of Audio Engineering Society, Volume 39, no. 7/8, 1991 July/August by R. W Adams et al," the paper by Casey and Angus mentioned above, and in the accompanying Annex.

It is desired that a signal processor may comprise a plurality of DSMs coupled in series or cascaded, to process 1-bit signals. Such a proposal is not known from the papers mentioned above.

The 1 bit signal at the input to a DSM comprises an audio component and a noise component. The present inventors have realised that the noise component of the input 1 bit signal reduces the stability of a DSM. The risk of instability may increase when DSMs are connected in series. It is believed that the present inventors are the first to recognise this problem.

SUMMARY OF THE INVENTION

According to one aspect of the present invention, there is provided an nth order Delta Sigma Modulator (DSM) where $n \geq 1$, comprising an input for receiving a 1-bit input signal having a signal component and a noise component.

a quantizer for re-quantizing a p-bit signal (where p>1) to 1-bit form, the re-quantised 1-bit signal being the output signal of the DSM a first combiner for forming the integral of an additive combination of the product of the input 1-bit signal and a coefficient and of the product of the output signal and a coefficient, n–1 intermediate combiners each for forming the integral of an additive combination of the product of the input 1-bit signal and a coefficient, of the product of the output signal and a coefficient and of the integral of the additive combination of the preceding combiner and a final combiner for forming an additive combination of the input signal and a coefficient and of the integral of the additive combination of the preceding combiner to form the said p-bit signal re-quantised by the quantizer, wherein the transfer function applied by the DSM to the input 1-bit signal is $$\frac{a_0(1 + a_1 z^{-1})(1 + a_2 z^{-1})(1 + a_3 z^{-1})\ldots(1 + a_n z^{-1})}{(1 + b_1 z^{-1})(1 + b_2 z^{-1})(1 + b_3 z^{-1})\ldots(1 + b_n z^{-1})}$$

the transfer function applied to the quantized noise introduced by the quantizer is $$\frac{(1 - z^{-1})^n}{(1 + b_1 z^{-1})(1 + b_2 z^{-1})(1 + b_3 z^{-1})\ldots(1 + b_n z^{-1})}$$

wherein at least one of $a_1$ to $a_n = +1$ and $b_1$, to $b_n \neq +1$.

It will be appreciated that where n=1, the transfer functions reduce to $$\frac{a_0(1 + a_1 z^{-1})}{(1 + b_1 z^{-1})} \text{ and } \frac{(1 - z^{-1})}{(1 + b_1 z^{-1})}$$

In a prior proposal for another order DSM, $a_1$ to $a_n$ were chosen to equal $b_1$ to $b_n$ respectively so that the poles of the input signal transfer function were cancelled by the corresponding zeroes of the input signal transfer function, to give a neutral or flat frequency response: see accompanying FIG. 4(a). In accordance with the present invention, $a_1$ to $a_n$ are chosen independently of $b_1$ to $b_n$. It will be noted that the noise shaping function $$\frac{(1 - z^{-1})^n}{(1 + b_1 z^{-1})\ldots(1 + b_n z^{-1})}$$

is unaffected by the choice of $a_1$ to $a_n$. Thus in accordance with the invention the zeroes of the input signal transfer function are defined in the DSM independently of the poles and zeroes of the noise shaping function.

In an embodiment of the invention where n=3 for example, the $a_1$ to $a_n$ of the input signal transfer function are chosen to all equal +1, so that the zeroes defined thereby are equal to but of opposite sign to the zeroes of the noise shaping function. That provides for the input signal a low pass filter characteristic complementary to the high pass filter characteristic of the noise signal, both characteristics having the same "corner frequency".

Thus noise shaping of quantisation noise produced in the DSM and attenuation of the noise component of the 1-bit input signal is provided in the DSM without increasing the order of the DSM. By way of explanation a prior proposed DSM of eg order n=3 has a flat frequency response with respect to the input signal and provides the required noise shaping of the quantizer noise. By the addition of e.g. a second order equalization section (giving n=5) the required low pass filtering of the noise in the input signal is additionally provided. Such a proposal is unsatisfactory in comparison with the present invention because it unnecessarily increases the order of the filter to provide the low pass filter response for filtering the noise in the input signal.

In a most preferred embodiment of the invention, $n \geq 3$ a subset of the $a_1$ to $a_n$ provide low pass filtering of the 1-bit input signal high pass filtering is applied to the quantisation noise by the noise shaping function and the remainder of $a_1$ to $a_n$ additionally provide a predetermined equalization to the 1-bit input signal. Preferably n=5, the subset comprises $a_1$ to $a_3$ where $a_1$ to $a_3$ equal +1 and the equalisation is provided by $a_4$ and $a_5$. By way of comparison with the aforesaid prior proposal, the prior proposal would need to be of order n=7 to also provide equalisation. That is unsatisfactory because the higher the order of the DSM the larger the signal processing delay and the greater the risk of instability.

By way of further comparison, it is possible to reduce the quantisation noise in the 1-bit input signal prior to inputting the 1-bit signal into the DSM by low pass filter at the input to the DSM. However such a low pass filtering would result in a p-bit signal input to the DSM requiring p-bit multipliers in the DSM thus losing one of the major advantages of a 1-bit DSM.

According to another aspect of the present invention, there is provided an nth order DSM where $n \geq 2$, comprising an input for receiving a 1-bit input signal having a signal component and a noise component.

a quantizer for re-quantizing a p-bit signal (where p>1) to 1-bit form, the re-quantised 1-bit signal being the output signal of the DSM a first combiner for forming the integral of an additive combination of the product of the input 1-bit signal and a coefficient and of the product of the output signal and a coefficient, n–1 intermediate combiners each for forming the integral of an additive combination of the product of the input 1-bit signal and a coefficient, of the product of the output signal and a coefficient and of the integral of the additive combination of the preceding combiner and a final combination for forming an additive combination of the input signal and a coefficient and of the integral of the combination of the preceding combiner to form the said p-bit signal re-quantised by the quantizer wherein the DSM has a transfer function with respect of the input signal of $$\frac{A(z)}{B(z)} \cdot \frac{C(z)}{D(z)}$$

-continued where $$\frac{A(z)}{B(z)} = \frac{a_0(1+z^{-1})^m}{(1+b_1z^{-1})\dots(1+b_mz^{-1})}$$

where m<n to provide low pass filtering of the input signal, $$\frac{C(z)}{D(z)} = \frac{(1+c_1z^{-1})\dots(1+c_{n-m}z^{-1})}{(1+d_1z^{-1})\dots(1+d_{n-m}z^{-1})}$$

to provide a predetermined equalisation to the input signal, and the DSM has a noise shaping transfer function $$\frac{Y(z)}{Q(z)}$$

with respect to the quantisation noise introduced by the DSM where $$\frac{Y(z)}{Q(z)} = \frac{(1-z^{-1})^n}{(1+b_1z^{-1})\dots(1+b_mz^{-1})(1+d_1z^{-1})\dots(1+d_{n-m}z^{-1})}$$

It will be noted that when n=2, m=1, $$\frac{A(z)}{B(z)} = \frac{a_0(1+z^{-1})}{(1+b_1z^{-1})} \frac{C(z)}{D(z)} = \frac{(1+cz^{-1})}{(1+d_1z^{-1})} \text{ and } \frac{Y(z)}{Q(z)} = \frac{(1-z^{-1})^2}{(1+b_1z^{-1})(1+d_1z^{-1})}$$

According to a further aspect of the present invention, there is provided an nth order Delta Sigma Modulator (DSM) where n≧2, comprising an input for receiving a 1-bit input signal having a signal component and a noise component.

a quantizer for re-quantizing a p-bit signal (where p>1) to 1-bit form, the re-quantised 1-bit signal being the output signal of the DSM a first combiner for forming the integral of an additive combination of the product of the input 1-bit signal and a coefficient and of the product of the output signal and a coefficient, n−1 intermediate combiners each for forming the integral of an additive combination of the product of the input 1-bit signal and a coefficient, of the product of the output signal and a coefficient and of the integral of the additive combination of the preceding combiner and a final combination for forming an additive combination of the input signal and a coefficient and of the integral of the combination of the preceding combiner to form the said p-bit signal re-quantised by the quantizer, wherein the transfer function applied by the DSM to the input 1-bit signal is $$\frac{a_0(1+a_1z^{-1})(1+a_2z^{-1})(1+a_3z^{-1})\dots(1+a_nz^{-1})}{(1+b_1z^{-1})(1+b_2z^{-1})(1+b_3z^{-1})\dots(1+b_nz^{-1})}$$

the transfer function applied to the quantized noise introduced by the quantizer is $$\frac{(1-z^{-1})^n}{(1+b_1z^{-1})(1+b_2z^{-1})(1+b_3z^{-1})\dots(1+b_nz^{-1})}$$

a subset of the $a_1$ to $a_n$ provide low pass filtering of the 1-bit input signal, the transfer function applied to the said quantisation noise introduced by the DSM has a high pass noise shaping characteristic, and the remainder of the $a_1$ to $a_n$ provide equalisation to the 1-bit signal additional to the low pass filtering.

BRIEF DESCRIPTION OF THE DRAWINGS

The above and other objects, features and advantages of the invention will be apparent from the following detailed description of illustrative embodiments which is to be read in connection with the accompanying drawings, in which:

FIG. 4(b) is a pole-zero diagram illustrating the positions of the poles and zeroes of an illustrative, preferred DSM in accordance with the invention;

FIG. 5 is a schematic block diagram of an illustrative 3rd order DSM according to the present invention;

FIG. 8 shows a plurality of DSMs connected in series; and

FIG. 9 illustrates an integrator of a DSM.

DESCRIPTION OF THE PREFERRED EMBODIMENTS

Figure 1:
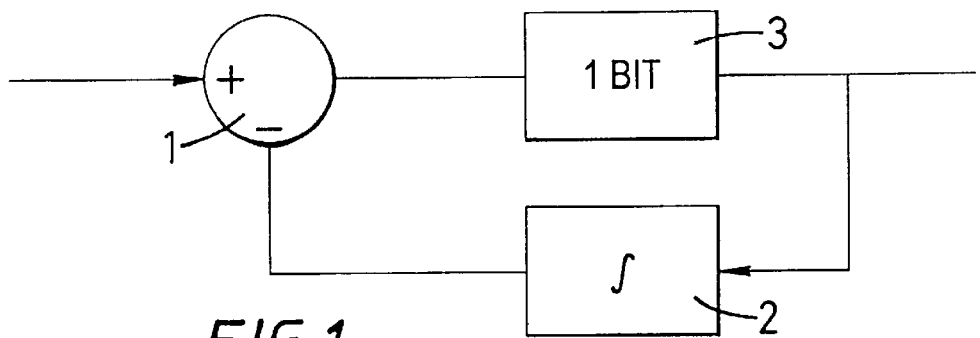
Figure 2:
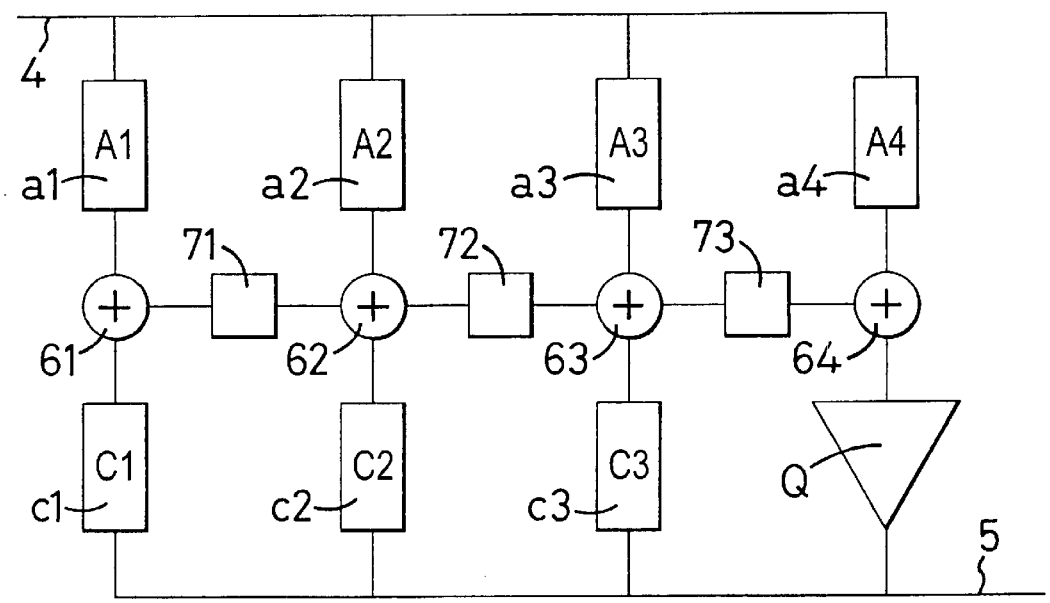
Figure 3:
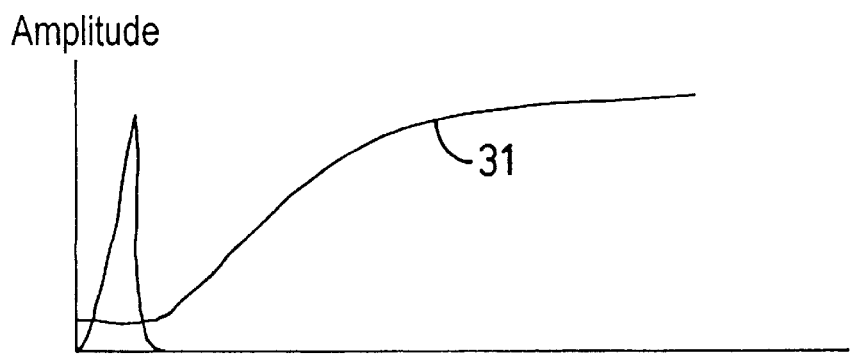

The Delta-Sigma Modulator (DSM) of FIG. 5 is a 3rd order DSM having three integrator sections and a final section. The DSM has an input 4 for receiving a 1-bit audio signal and an output 5 at which a processed 1-bit signal is produced.

The signal at output 5 is produced by a quantizer Q in the final stage. Quantizer Q receives a p bit signal where p>1. The quantizer Q maybe a comparator having a threshold of zero. The quantizer quantizes positive signals as +1 (logical 1) and quantizes negative signals as −1 (logic 0).

The first Combining section comprises a first 1-bit multiplier a connected to the input 4, a second 1-bit coefficient multiplier A connected to the output 5, an adder 61 which sums the outputs of the 1-bit multipliers a1 and A1 and an integrator 71 which integrates the output of the adder 61. The 1-bit coefficient multipliers multiply the 1-bit signals by p-bit coefficients a and A.

Each of the two intermediate Combiner sections likewise comprises a first 1-bit coefficient multiplier b, c connected to the input 4, a second 1-bit coefficient multiplier B, C connected to the output 5, an adder 62, 63, and an integrator 72, 73. The adders 62, 63, receive in addition to the outputs of the coefficients multipliers the output of the integrator of the preceding stage.

The final stage comprises a 1 bit coefficient multiplier d connected to an adder 64 which also receives the output of the integrator 73. The quantizer Q quantizes the p bit output of the adder 64 to produce the 1 bit signal at the output 5.

An example of the integrator 71 is shown in FIG. 9 and comprises an adder in series with a delay element. The output of the delay element is fed back to the adder to accumulate the integral of the output of the adder which sums the outputs of the coefficient multipliers. As shown in FIG. 5 the adder of the integrator may be implemented by the adder 61 which sums the outputs of the coefficient multipliers of the stage. Thus it is not essential to have separate adders for the coefficient multipliers and for the integrator 3.

For the situation shown in FIG. 5 where the coefficients a, b, c and d and A, B, C are fixed and a separate adder is provided in the integrator as shown in FIG. 9, the coefficient multipliers a, b, c and d and the adder which sums the outputs of the coefficient multipliers may be replaced by a look-up table. For a 1-bit signal multiplied by a coefficient a and by a coefficient A the outputs are +a, −a, +A, −A. A look-up table can conveniently store all the possible combinations of +a and a and +A and −A; the store would be addressed by the 1-bit signals.

As discussed above the coefficients a to d and A to C may be chosen by the methods described in the above-mentioned papers, and in the accompanying Annex.

In accordance with the present invention, the inventors note that the 1 bit input signal at input 4 has an audio component and a noise component produced by the 1 bit quantization process. The noise component at least reduces the stability of the DSM especially when several DSMs are connected in series. Furthermore the effect of DSMs in series is to increase the noise content 1-bit of the signal significantly. It is desired to reduce the noise component.

Figure 6:
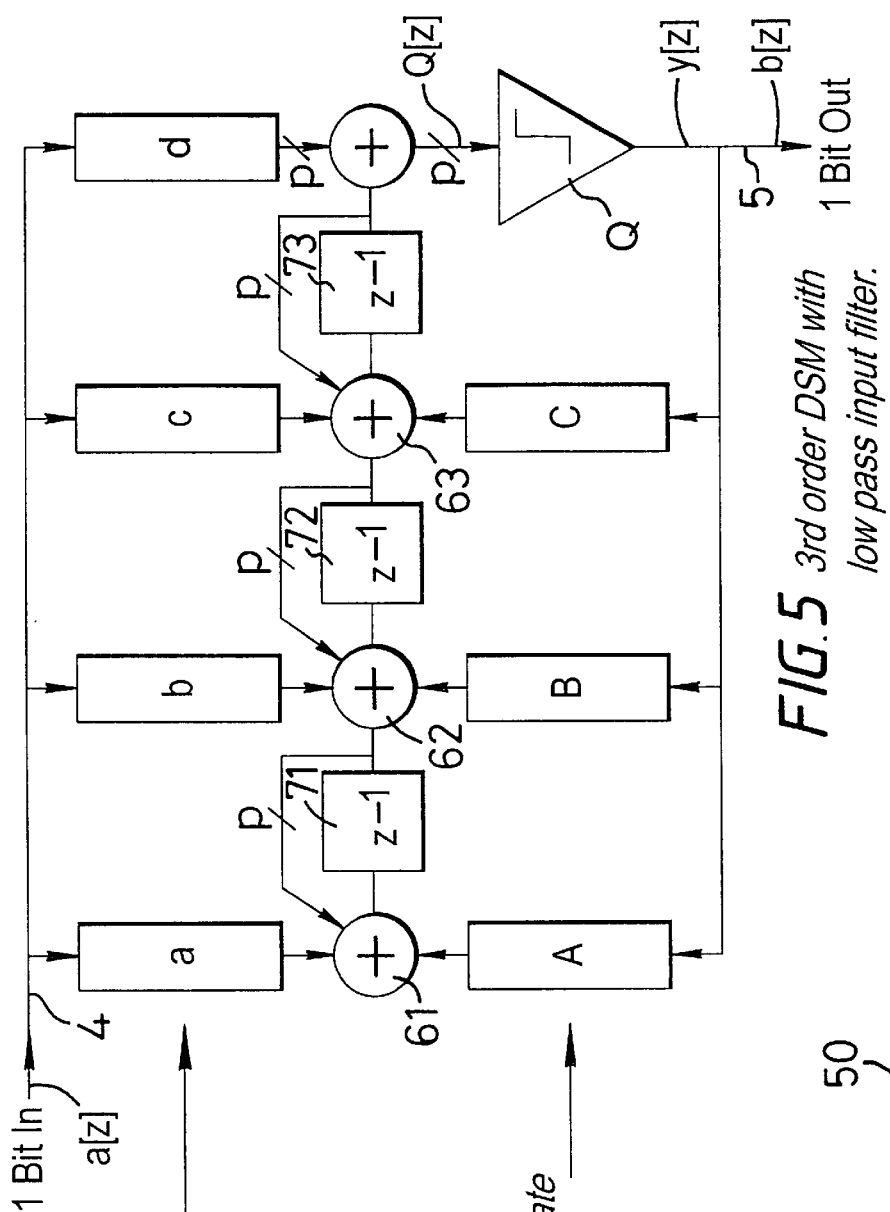
FIG. 6 is frequency/amplitude diagram illustrating the effect of the DSM of FIG. 5 on an input signal.

In accordance with an illustrative embodiment of the invention a filter characteristic as shown in FIG. 6 is provided. Referring to FIG. 6, line 50 illustrates a noise shaping characteristic applied to the quantisation noise generated by the quantizer Q in the DSM. Where the 1-bit signal input to the DSM is from a previous DSM characteristic 50 also represents the noise component of the input signal. Line 51 illustrates a practical filter characteristic for the audio component.

When DSMs in accordance with the invention are connected in series as shown in for example FIG. 8, the input signal to one DSM contains an audio component in the low frequency region of the shaped noise characteristic 50 plus the frequency shaped noise indicated by characteristic 50. The DSM applies to the audio and the noise the low pass filter characteristic 51 reducing the noise in the signal input to the DSM. The DSM introduces new quantization noise so that the output signal of the DSM again comprises an audio component in the low frequency region of the shaped noise characteristic together with frequency shaped noise indicated by characteristic 50.

However, when DSMs are connected in series the total amount of noise produced by the series of DSMs is reduced using the present invention as compared to not using the present invention.

Referring to FIG. 5, in the embodiment of the invention, the input 1 bit audio signal with its noise component is subjected to a transfer function:

$$\frac{A(z)}{B(z)} = \frac{a_0(1 + a_1 z^{-1})(1 + a_2 z^{-1})(1 + a_3 z^{-1})}{(1 + b_1 z^{-1})(1 + b_2 z^{-1})(1 + b_3 z^{-1})}$$

Where $a_0$ is a gain factor, $a_0$, $a_2$, to $a_3$ define the feed forward coefficients a to d and $b_1$, $b_2$, $b_3$ define the feedback coefficients A to C. The gain factor $a_0$ is chosen to compensate for any attenuation introduced by placing the zeroes of the audio signal transfer function at $z^{-1} = -1$.

The numerator defines the zeroes of the audio signal transfer function and the denominator defines the poles of the audio signal transfer function.

The Quantizer Q introduces quantisation noise into the audio input signal. In accordance with the present embodiment the noise is subject to a noise shaping transfer function:

$$\frac{Y(z)}{Q(z)} = \frac{(1 - z^{-1})(1 - z^{-1})(1 - z^{-1})}{(1 + b_1 z^{-1})(1 + b_2 z^{-1})(1 + b_3 z^{-1})}$$

where $b_1$ to $b_3$ define the noise feedback coefficients A to C and the −1 multipliers of $z_{-1}$ in the numerator are implemented by the integrators 71 to 73.

Thus, in accordance with the present embodiment the poles of the audio signal transfer function are the same as the poles of the noise shaping function and the zeroes $(1+Z^{-1})$ of the audio signal transfer function are complementary to the zeroes $(1-Z^{-1})$ of the noise shaping function.

Referring to FIG. 4(b), the poles and zeroes of the audio signal transfer function and of the noise shaping function and of the noise shaping function are plotted on the complex Z plane. The audio zeroes are positioned on the real axis at −1 diametrically opposite the zeroes +1 of the noise shaping function. Thus the audio signal is subject to a filter characteristic 51 which is complementary to the filter characteristic 50 applied to the noise generated in the DSM, as shown in FIG. 6.

Although the invention has been illustrated with reference to a DSM of order n=3, it is not limited to that. The DSM may have any order including n=1. Increasing the order reduces pattern noise but the higher the order the larger the signal delay through the DSM and the greater the risk of instability. Thus it is desirable to minimise the order.

The embodiment of FIGS. 4(b) and 5 provides only low pass filtering of the audio input signal. However a DSM in accordance with the invention may provide both low pass filtering to reduce quantisation noise as described with reference to FIGS. 4(b), 5 and 6 and equalisation of the audio signal.

Figure 7:
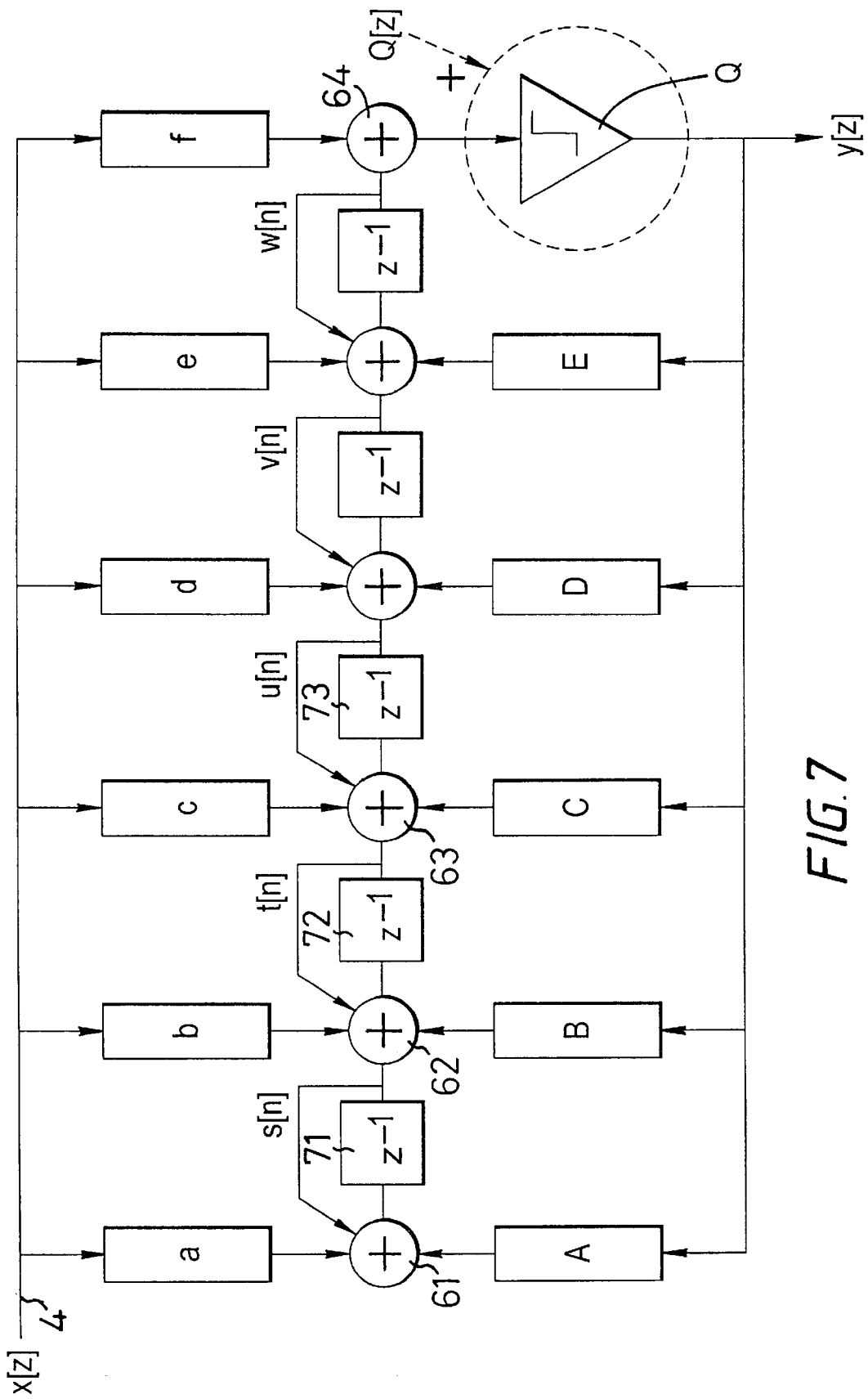
FIG. 7 shows a fifth order DSM incorporating the present invention.

Referring to FIG. 7, there is shown a 5th order DSM. In accordance with an embodiment of the present invention the DSM of FIG. 7 has a transfer function $$\frac{Y(z)}{X(z)}$$

applied to the input audio signal where $\frac{Y(z)}{X(z)} = \frac{A(z)}{B(z)} \cdot \frac{C(z)}{D(z)}$ where $\frac{A(z)}{B(z)} = \frac{a_0(1 + z^{-1})(1 + z^{-1})(1 + z^{-1})}{(1 + b_1 z^{-1})(1 + b_2 z^{-1})(1 + b_3 z^{-1})}$ and whereby the desired low pass filter characteristic is applied to the input signal, and $$\frac{C(z)}{D(z)} = \frac{c_0(1 + c_1 z^{-1})(1 + c_2 z^{-1})}{(1 + d_1 z^{-1})(1 + d_2 z^{-1})}$$

whereby a desired equalisation is applied to the input signal.

The noise shaping transfer function $$\frac{Y(z)}{Q(z)} = \frac{(1-z^{-1})^5}{(1+b_1z^{-1})(1+b_2z^{-1})(1+b_3z^{-1})(1+d_1z^{-1})(1+d_2z^{-1})}$$

Although in this example a third order low pass filter characteristic is achieved with a second order equalisation characteristic, the characteristics may have other orders.

By low pass filtering the input signal within the DSM, thus reducing the quantisation noise in the signal, a plurality of DSMs may be connected in series as shown in FIG. 8 with reduced risk of instability.

Reference will now be made to Appendix A and its accompanying FIGS. 10 and 11. Appendix A derives the transfer functions of a 5th order DSM.

The form of the derived transfer functions differs from these given hereinbefore it will be appreciated that the transfer functions given in Appendix A are equivalent to those given above.

The analysis depends on the assumption that the quantizer Q is modelled as an adder which adds to the 1-bit signal at the input, a random signal represents quantisation noise.

The analysis shows that:

In general the poles and zeroes are placed in a complex plane.

The poles of the audio filter may be equal to the poles of the noise shaper: See FIG. 4(*a*)

In accordance with preferred embodiments of the present invention, the zeros of the audio filter function are placed at $z^{-1}=-1$, and the poles are placed at positions where $z^{-1}$ is not equal to −1: see FIG. 4(*b*), so that the audio is processed by a low pass filter having the same corner frequency as the noise shaper: See FIG. 6.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

APPENDIX A

Noise Shaping Filter Function for a Fifth Order Delta Sigma Modulator

Given the structure in FIG. 10, we can write the following for a fifth order modulator's noise shaping filter response:

y[n]=q[n]+x[n]
x[n]=x[n−1]+w[n−1]+Ey[n−1]
w[n]=w[n−1]+v[n−1]+Dy[n−1]
v[n]=v[n−1]+u[n−1]+Cy[n−1]
u[n]=u[n−1]+t[n−1]+By[n−1]
t[n]=t[n−1]+Ay[n−1]
Using the z-transform, and letting $$\alpha = \frac{z^{-1}}{(1-z^{-1})},$$

this can be written as:
Y(z)=Q(z)+X(z)
X(z)=α(W(z)+EY(z))
W(z)=α(V(z)+DY(z))
V(z)=α(U(z)+CY(z))
U(z)=α(T(z)+BY(z))
T(z)=αAY(z)

Solving for Y(z) in terms of Q(z), we have:

$$Y(z)[(1-z^{-1})-z^{-1}(E+\alpha D+\alpha^2 C+\alpha^3 B+\alpha^4 A)]=(1-z^{-1})Q(z)$$

replacing α, this yields for a fifth order modulator:
Equation A.1

$$H_{ns}(z) = \frac{Y(z)}{Q(z)} = \frac{(1-z^{-1})^5}{(1-z^{-1})^5 - Ez^{-1}(1-z^{-1})^4 - Dz^{-2}(1-z^{-1})^3 - Cz^{-3}(1-z^{-1})^2 - Bz^{-4}(1-z^{-1}) - Az^{-5}}$$

The equation $H_{ns}(z)$ gives all zeroes at DC, and may be made to exactly match the design of a standard Butterworth or Chebyshev type I high pass filter. The function may be generalised for any order.

Audio Filter Function for a Fifth Order Delta Sigma Modulator

Given the structure in FIG. 11, we can write the following for a fifth order modulator's noise shaping filter response:

y[n]=fx[n]+w[n]+q[n]
w[n]=w[n−1]+ex[n−1]+Ey[n−1]+v[n−1]
v[n]=v[n−1]+dx[n−1]+Dy[n−1]+u[n−1]
u[n]=u[n−1]+cx[n−1]+Cy[n−1]+t[n−1]
t[n]=t[n−1]+bx[n−1]+By[n−1]+s[n−1]
s[n]=s[n−1]+ax[n−1]+Ay[n−1]
Using the z-transform, and letting $$\alpha = \frac{z^{-1}}{(1-z^{-1})},$$

this can be written as:
Y(z)=fX(z)+W(z)+Q(z)
W(z)=α(eX(z)+EY(z)+V(z))
V(z)=α(dX(z)+DY(z)+U(z))
U(z)=α(cX(z)+CY(z)+T(z))
T(z)=α(bX(z)+BY(z)+S(z))
S(z)=α(aX(z)+AY(z))
Solving for Y(z) in terms of X(z) and Q(z), we have:

$$Y(z)[1-\alpha^5 A-\alpha^4 B-\alpha^3 C-\alpha^2 D-\alpha E]=X(z)[\alpha^5 a+\alpha^4 b+\alpha^3 c+\alpha^2 d+\alpha e+f]+Q(z)$$

Since Q(z) is shaped by the noise shaper such that it is zero at DC, it can be approximated to zero near DC, which is valid for audio signals when the sample rate is very much greater that the audio bandwidth, i.e. Of the order of megahertz. Thus we have for a fifth order modulator:
Equation A.2

$$H_A(z) = \frac{Y(z)}{X(z)} = \frac{f(1-z^{-1})^5 + ez(1-z^{-1})^4 + dz^{-2}(1-z^{-1})^3 + cz^{-3}(1-z^{-1})^2 + bz^{-4}(1-z^{-1}) + az^{-5}}{(1-z^{-1})^5 - Ez^{-1}(1-z^{-1})^4 - Dz^{-2}(1-z^{-1})^3 - Cz^{-3}(1-z^{-1})^2 - Bz^{-4}(1-z^{-1}) - Az^{-5}}$$

It can be seen the numerator and the denominator of $H_A(z)$ may be made to cancel out by equating variables in the following manner:
f=1,e=−E,d=−D,c=−C,b=−B,a=−A Thus the poles and zeros of the audio transfer function may be made to cancel out, resulting in a flat audio response. This function may be generalised for any order.

We claim:

1. An n th order Delta Sigma Modulator (DSM) where $n \geq$, comprising an input for receiving a 1-bit input signal having a signal component and a noise component, a quantizer for re-quantizing a p-bit signal (where p>1) to 1-bit form, the re-quantised 1-bit signal being the output signal of the DSM, a first combiner for forming the integral of an additive combination of the product of the input 1-bit signal and a coefficient and of the product of the output signal and a coefficient, n−1 intermediate combiners each for forming the integral of an additive combination of the product of the input 1-bit signal and a coefficient, of the product of the output signal and a coefficient and of the integral of the additive combination of the preceding combiner, and a final combiner for forming an additive combination of the input signal and a coefficient and of the integral of the combination of the preceding combiner to form the said p-bit signal re-quantised by the quantizer, wherein the transfer function applied by the DSM to the input 1-bit signal is $$\frac{a_0(1+a_1z^{-1})(1+a_2z^{-1})(1+a_3z^{-1})\ldots(1+a_nz^{-1})}{(1+b_1z^{-1})(1+b_2z^{-1})(1+b_3z^{-1})\ldots(1+b_nz^{-1})}$$

the transfer function applied to the quantized noise introduced by the quantizer is $$\frac{(1-z^{-1})^n}{(1+b_1z^{-1})(1+b_2z^{-1})(1+b_3z^{-1})\ldots(1+b_nz^{-1})}$$

wherein at least one of $a_1$ to $a_n$ equals +1, and each of $b_1$ to $b_n$ is not equal to +1, and wherein the zeroes of the transfer function applied by the DSM to the input 1-bit signal are defined in the DSM independently of the poles and zeroes of the transfer function applied to the quantized noise introduced by the quantizer.

2. A DSM according to claim 1, wherein each of $a_1$ to $a_n$=+1.

3. A DSM according to claim 1, wherein $a_0$=1.

4. A DSM according to claim 1, wherein n=3.

5. A DSM according to claim 1, wherein $n \geq 3$, and a sub-set of the $a_1$ to $a_n$ provide low pass filtering of the 1-bit input signal and the remainder of $a_1$ to $a_n$ additionally provide a predetermined equalisation to the 1-bit input signal.

6. A DSM according to claim 5 wherein each of $a_1$ to $a_n$ in the said subset=+1.

7. A DSM according to claim 5, wherein n=5.

8. An n th order DSM where $n \geq 2$, comprising an input for receiving a 1-bit input signal having a signal component and a noise component, a quantizer for re-quantizing a p-bit signal (where p>1) to 1-bit form, the re-quantised 1-bit signal being the output signal of the DSM, a first combiner for forming the integral of an additive combination of the product of the input 1-bit signal and a coefficient and of the product of the output signal and a coefficient, n−1 intermediate combiners each for forming the integral of an additive combination of the product of the input 1-bit signal and a coefficient, of the product of the output signal and a coefficient and of the integral of the additive combination of the preceding combiner, and a final combiner for forming an additive combination of the input signal and a coefficient and of the integral of the combination of the preceding combiner to form the said p-bit signal re-quantised by the quantizer, wherein the DSM has a transfer function with respect of the input signal of $$\frac{A(z)}{B(z)} \cdot \frac{C(z)}{D(z)}$$

where $$\frac{A(z)}{B(z)} = \frac{a_0(1+z^{-1})^m}{(1+b_1z^{-1})\ldots(1+b_mz^{-1})}$$

where m<n to provide low pass filtering of the input signal, $$\frac{C(z)}{D(z)} = \frac{(1+c_1z^{-1})\ldots(1+c_{n-m}z^{-1})}{(1+d_1z^{-1})\ldots(1+d_{n-m}z^{-1})}$$

to provide a predetermined equalisation to the input signal, and the DSM has a noise shaping transfer function $$\frac{Y(z)}{Q(z)}$$

with respect to the quantisation noise introduced by the DSM where $$\frac{Y}{Q} = \frac{(1-z^{-1})^n}{(1+b_1z^{-1})\ldots(1+b_mz^{-1})(1+d_1z^{-1})\ldots(1+d_{n-m}z^{-1})}$$

and, wherein the zeroes of the transfer function with respect to the input signal are defined in the DSM independently of the poles and zeroes of the noise shaping transfer function.

9. A DSM according to claim 8, wherein m=3 and n=5.

10. An n th order Delta Sigma Modulator (DSM) where $\geq 2$, comprising an input for receiving a 1-bit input signal having a signal component and a noise component, a quantizer for re-quantizing a p-bit signal (where p>1) to 1-bit form, the re-quantised 1-bit signal being the output signal of the DSM, a first combiner for forming the integral of an additive combination of the product of the input 1-bit signal and a coefficient and of the product of the output signal and a coefficient, n−1 intermediate combiners each for forming the integral of an additive combination of the product of the input 1-bit signal and a coefficient, of the product of the output signal and a coefficient and of the integral of the additive combination of the preceding combiner, and a final combiner for forming an additive combination of the input signal and a coefficient and of the integral of the combination of the preceding combiner to form the said p-bit signal re-quantised by the quantizer, wherein the transfer function applied by the DSM to the input 1-bit signal is $$\frac{a_0(1+a_1z^{-1})(1+a_2z^{-1})(1+a_3z^{-1})\ldots(1+a_nz^{-1})}{(1+b_1z^{-1})(1+b_2z^{-1})(1+b_3z^{-1})\ldots(1+b_nz^{-1})}$$

the transfer function applied to the quantized noise introduced by the quantizer is $$\frac{(1-z^{-1})^n}{(1+b_1z^{-1})(1+b_2z^{-1})(1+b_3z^{-1})\ldots(1+b_nz^{-1})}$$

a subset of the $a_1$ to $a_n$ provide low pass filtering of the 1-bit input signal, the transfer function applied to the said quantisation noise introduced by the DSM has a high pass noise shaping characteristic, and the remainder of the $a_1$ to $a_n$ provide equalisation to the 1-bit signal additional to the low pass filtering, and wherein the zeroes of the transfer function applied by the DSM to the input 1-bit signal are defined in the DSM independently of the poles and zeroes of the transfer function applied to the quantized noise introduced by the quantizer.

11. A plurality of Delta Sigma Modulators arranged in series, each of said Delta Sigma Modulators comprising an n th order Delta Sigma Modulator (DSM) where $n \geq 1$, comprising an input for receiving a 1-bit input signal having a signal component and a noise component;

a quantizer for re-quantizing a p-bit signal (where p>1) to 1-bit form the re-quantised 1-bit signal being the output of the DSM;

a first combiner for forming the integral of an additive combination of the product of the input 1-bit signal and a coefficient and of the product of the output signal and a coefficient;

n−1 intermediate combiners each for forming the integral of an additive combination of the product of the input 1-bit signal and a coefficient, of the product of the output signal and a coefficient and of the integral of the additive combination of the preceding combiner; and a final combiner for forming an additive combination of the input signal and a coefficient and of the integral of the combination of the preceding combiner to form the said p-bit signal re-quantised by the quantizer;

wherein the transfer function applied by the DSM to the input 1-bit signal is $$\frac{a_0(1+a_1z^{-1})(1+a_2z^{-1})(1+a_3z^{-1})\ldots(1+a_nz^{-1})}{(1+b_1z^{-1})(1+b_2z^{-1})(1+b_3z^{-1})\ldots(1+b_nz^{-1})}$$

the transfer function applied to the quantized noise introduced by the quantizer is $$\frac{(1-z^{-1})^n}{(1+b_1z^{-1})(1+b_2z^{-1})(1+b_3z^{-1})\ldots(1+b_nz^{-1})}$$

wherein at least one of $a_1$ to $a_n$ equals +1, and each of $b_1$ to $b_n$ is not equal to +1.

12. A plurality of Delta Sigma Modulators (DSM) arranged in series, each of said Delta Sigma Modulators comprising an n th order DSM where $n \geq 2$, comprising an input for receiving a 1-bit input signal having a signal component and a noise component;

a quantizer for re-quantizing a p-bit signal (where p>1) to 1-bit form, the re-quantised 1-bit signal being the output signal of the DSM;

a first combiner for forming the integral of an additive combination of the product of the input 1-bit signal and a coefficient and of the product of the output signal and a coefficient;

n−1 intermediate combiners each for forming the integral of an additive combination of the product of the input 1-bit signal and a coefficient, of the product of the output signal and a coefficient and of the integral of the additive combination of the preceding combiner; and a final combiner for forming an additive combination of the input signal and a coefficient and of the integral of the combination of the preceding combiner to form the said p-bit signal re-quantised by the quantizer;

wherein the DSM has a transfer function with respect of the input signal of $$\frac{A(z)}{B(z)} \cdot \frac{C(z)}{D(z)}$$

where $$\frac{A(z)}{B(z)} = \frac{a_0(1+z^{-1})^m}{(1+b_1z^{-1})\ldots(1+b_mz^{-1})}$$

where m<n to provide low pass filtering of the input signal, $$\frac{C(z)}{D(z)} = \frac{(1+c_1z^{-1})\ldots(1+c_{n-m}z^{-1})}{(1+d_1z^{-1})\ldots(1+d_{n-m}z^{-1})}$$

to provide a predetermined equalisation to the input signal, and the DSM has a noise shaping transfer function $$\frac{Y(z)}{Q(z)}$$

with respect to the quantisation noise introduced by the DSM where $$\frac{Y}{Q} = \frac{(1-z^{-1})^n}{(1+b_1z^{-1})\ldots(1+b_mz^{-1})(1+d_1z^{-1})\ldots(1+d_{n-m}z^{-1})}$$

13. A plurality of Delta Sigma Modulators arranged in series, each of said Delta Sigma Modulators comprising an n th order Delta Sigma Modulator (DSM) where $n \geq 2$, comprising an input for receiving a 1-bit input signal having a signal component and a noise component, a quantizer for re-quantizing a p-bit signal (where p>1) to 1-bit form, the re-quantised 1-bit signal being the output signal of the DSM;

a first combiner for forming the integral of an additive combination of the product of the input 1-bit signal and a coefficient and of the product of the output signal and a coefficient;

n−1 intermediate combiners each for forming the integral of an additive combination of the product of the input 1-bit signal and a coefficient, of the product of the output signal and a coefficient and of the integral of the additive combination of the preceding combiner; and a final combiner for forming an additive combination of the input signal and a coefficient and of the integral of the combination of the preceding combiner to form the said p-bit signal re-quantised by the quantizer;

wherein the transfer function applied by the DSM to the input 1-bit signal is $$\frac{a_0(1+a_1z^{-1})(1+a_2z^{-1})(1+a_3z^{-1})\ldots(1+a_nz^{-1})}{(1+b_1z^{-1})(1+b_2z^{-1})(1+b_3z^{-1})\ldots(1+b_nz^{-1})}$$

the transfer function applied to the quantized noise introduced by the quantizer is $$\frac{(1-z^{-1})^n}{(1+b_1z^{-1})(1+b_2z^{-1})(1+b_3z^{-1})\ldots(1+b_nz^{-1})}$$

a subset of the $a_1$ to $a_n$ provide low pass filtering of the 1-bit input signal, the transfer function applied to the said quantisation noise introduced by the DSM has a high pass noise shaping characteristic, and the remainder of the $a_1$ to $a_n$ provide equalisation to the 1-bit signal additional to the low pass filtering.

* * * * *